(12) United States Patent
Toriya et al.

(10) Patent No.: US 7,367,350 B2
(45) Date of Patent: May 6, 2008

(54) PROCESSING DEVICE AND METHOD OF MAINTAINING THE DEVICE

(75) Inventors: Daisuke Toriya, Nirasaki (JP); Kenji Homma, Nirasaki (JP); Akihiko Tsukada, Nirasaki (JP); Kouji Shimomura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 425 days.

(21) Appl. No.: 10/503,126

(22) PCT Filed: Feb. 7, 2003

(86) PCT No.: PCT/JP03/01337

§ 371 (c)(1),
(2), (4) Date: Aug. 9, 2004

(87) PCT Pub. No.: WO03/067353

PCT Pub. Date: Aug. 14, 2003

(65) Prior Publication Data

US 2005/0115501 A1 Jun. 2, 2005

(30) Foreign Application Priority Data

Feb. 7, 2002 (JP) ............................ 2002-031055
Sep. 25, 2002 (JP) ............................ 2002-279181

(51) Int. Cl.
*G05D 7/06* (2006.01)
(52) U.S. Cl. .................. 137/15.04; 137/240; 137/486; 134/166 C; 134/22.14; 134/22.19; 134/95.1
(58) Field of Classification Search ................ 137/240, 137/15.05, 15.04, 486; 134/166 C, 169 C, 134/22.14, 22.19, 95.1
See application file for complete search history.

(56) References Cited

U.S. PATENT DOCUMENTS 5,660,201 A * 8/1997 Turner ........................ 137/240
5,690,743 A    11/1997 Murakami et al.
6,953,047 B2 * 10/2005 Birtcher et al. ............. 137/240

FOREIGN PATENT DOCUMENTS

| JP | 6-53103 | 2/1994 |
|---|---|---|
| JP | 6-102068 | 4/1994 |
| KR | 1996-0002583 | 1/1996 |

* cited by examiner

*Primary Examiner*—Kevin Lee
(74) *Attorney, Agent, or Firm*—Oblon, Spivak, McClelland, Maier & Neustadt, P.C.

(57) ABSTRACT

A film processing device using vaporized liquid source capable of confirming the flow control accuracy of flow control equipment such as a mass flow controller (15) controlling the flow of the liquid source without separating the flow control equipment from piping and disassembling the piping, comprising a bypass passage (41) for bypassing a part of a washing fluid feed passage (32) for feeding washing fluid to a liquid source feed passage (12) and a flowmeter such as an MFM (42), wherein the washing fluid is allowed to flow to the mass flow controller (15) through the MFM (42), and the flow of the washing fluid detected by the MFM (42) is compared with a target flow set in the mass flow controller (15) to check whether the mass flow controller (15) operates normally or not.

10 Claims, 12 Drawing Sheets

PROCESSING DEVICE AND METHOD OF MAINTAINING THE DEVICE

FIELD OF THE INVENTION

The present invention relates to a processing device and a method of maintaining same for use in a film forming process on a substrate such as semiconductor wafer, using a liquid source.

BACKGROUND OF THE INVENTION

In a film forming process on a semiconductor wafer (hereinafter refer to as wafer), a liquid source can be used. For example, when forming a tantalum oxide film which is used as DRAM's capacitor film, a liquid source, PET (Tantalum Pentaethoxide: $Ta(OC_2H_5)_5$) is used. When carrying out the film forming process, PET is transferred from a liquid source tank to a vaporizer through a piping, and vaporized therein. The PET flow rate to the vaporizer is controlled by a mass flow controller, which is a liquid flow controller, installed at the piping. In addition to vaporized PET, oxygen gas is supplied into a processing vessel where a wafer is loaded, to perform a film forming process.

When replacing the liquid source tank or the vaporizer, they are separated from the piping. Since PET solidifies when it comes in contact with moistures, the inside of the piping must be thoroughly washed by a washing fluid, such as alcohol to completely remove PET prior to exposing the piping to the atmosphere. Further, after coupling the piping, air must be completely forced out from the inside of the piping. If cleaning is not performed sufficiently, residual PET inside the piping reacts with the moistures in the air and solidifies, thereby attaching itself to the inside of the piping. Still further, if the washing fluid's water content is high, PET reacts with the moistures in the washing fluid and solidifies similarly. The mass flow controller gauges a fluid flow rate, based on the difference of heat transfers from the fluid at an upstream and a downstream point of a flow sensor. Therefore, if solidified PET is attached to the inside of the mass flow controller, the heat transfer is altered and reading (sensing) error occurs so that the PET flow rate may be several times higher than a rate set to the mass flow controller.

If PET flow rate deviates from a set flow rate, it is possible that the capacity of a capacitor cannot be obtained as planned. If the flow rate of PET is greater than a set flow rate, the amount of PET consumption becomes so high that not only the liquid source tank needs to be replaced frequently, the cleaning cycle of the processing vessel becomes short as well. Further, if the reading (sensing) accuracy of the mass flow controller declines, the integrating flow rate management by computer cannot be properly performed.

In order to prevent such problem, the mass flow controller is periodically separated from the piping and tested. This test is conducted in the following manner: alcohol is sent into the mass flow controller and the alcohol amount is measured by a mess cylinder, and the reading from the cylinder is compared with the flow rate set to the mass flow controller. However, the amount of PET used during film forming is small and the type of mass flow controller used is also for low flow rate applications, it is difficult to measure precisely the flow amount by using the mess cylinder.

Before separating the mass flow controller from the piping, the inside of the piping and the mass flow controller are cleaned. However, if cleaning is not performed sufficiently, residual PET inside the mass flow controller reacts with moistures in the air and becomes solidified. Further, if the air that gets into the piping is not completely removed after the testing is completed and the mass flow controller is reinstalled in the piping, there is a concern for PET solidification when it is sent through the piping. Since such solidified PET becomes, so to speak, similar to ceramic, it is practically impossible to clean and remove the solidified PET, and the mass flow controller must be replaced. Namely, there is a concern that malfunctioning of a mass flow controller can be attributed to the very process employed to confirm the mass flow controller's proper operation.

SUMMARY OF THE INVENTION

The present invention has been made under such a background. It is, therefore, a first object of the present invention to provide a technology capable of performing accurate testing of flow control equipment of a liquid source, without a need to separate the equipment from the feed passage of a liquid source or to disassemble the passage.

A second object of the present invention is to achieve the aforementioned first object without lowering the efficiency of cleaning the feed passage of the liquid source.

In accordance with one aspect of the present invention for achieving the objects, there is provided a processing device, including: a processing vessel in which a process is performed on an object to be processed by using a liquid source; a liquid source feed passage installed so as to supply the liquid source into the processing vessel from a liquid source feed source; a flow controller, installed at the liquid source feed passage, for controlling a flow rate of the liquid source flowing through the liquid source feed passage at a target flow rate; a washing fluid feed passage installed so as to supply a washing fluid from a washing fluid feed source to an upstream side of the flow controller in the liquid source feed passage; and a testing unit, installed at the washing fluid feed passage, having at least one of a function for measuring a flow rate of the washing fluid flowing through the washing fluid feed passage and that for controlling the flow rate of the washing fluid flowing through the washing fluid feed passage at a target flow rate, wherein the processing device is configured to enable the washing fluid to flow to the flow controller through the testing unit.

Further, the processing device of the present invention may include a determination unit for determining whether the flow controller properly operates or not on the basis of a comparison of a target flow rate of the washing fluid set in the flow controller with an actual flow rate of the washing fluid measured by the testing unit in case of flowing the washing fluid to the flow controller through the testing unit, or a comparison of an actual flow rate of the washing fluid measured by a flow sensor prepared in the flow controller with a target flow rate set in the testing unit in case of flowing the washing fluid to the flow controller through the testing unit.

In accordance with another aspect of the present invention, there is provided a processing device, including: a processing vessel in which a process is performed on an object to be processed by using a liquid source; a liquid source feed passage installed so as to supply the liquid source into the processing vessel from a liquid source feed source; a flow controller, installed at the liquid source feed passage, for controlling a flow rate of the liquid source flowing through the liquid source feed passage at a target flow rate; a washing fluid feed passage installed so as to supply a washing fluid from a washing fluid feed source to an upstream side of the flow controller in the liquid source feed passage; a bypass passage whose one end is connected to the washing fluid feed passage, and, at the same time, the other end is connected to the washing fluid feed passage or the liquid source feed passage, and which bypasses a part of the washing fluid feed passage; a testing unit, installed at the bypass passage, having at least one of a function for measuring a flow rate of the washing fluid flowing through the bypass passage and that for controlling the flow rate of the washing fluid flowing through the bypass passage at a target flow rate; and a valve for switching between a first state, in which the washing fluid is supplied into the liquid source feed passage through the bypass passage, and a second state, in which the washing fluid is supplied into the liquid source feed passage without passing through the bypass passage, wherein the processing device is configured to enable the washing fluid to flow to the flow controller through the testing unit installed at the bypass passage.

Further, the processing device of the present invention may include a flow adjuster, which is installed at the part of the washing fluid feed passage and controls a flow rate of the washing fluid supplied into the liquid source feed passage through the part of the washing fluid feed passage.

Still further, the processing device of the present invention may include a flow adjuster, which is installed at an upstream side of the part of the washing fluid feed passage and at least controls a flow rate of the washing fluid supplied into the liquid source feed passage through the part of the washing fluid feed passage.

In accordance with still another aspect of the present invention, there is provided a processing device, including: a processing vessel in which a process is performed on an object to be processed by using a liquid source; a liquid source feed passage installed so as to supply the liquid source into the processing vessel from a liquid source feed source; a flow controller, installed at the liquid source feed passage, for controlling a flow rate of the liquid source flowing through the liquid source feed passage at a target flow rate; a testing unit for having at least one of a function for measuring a flow rate of a washing fluid flowing through the testing unit and that for controlling the flow rate of the washing fluid flowing through the testing unit at a target flow rate; a first washing fluid feed passage connected to the liquid source feed passage, and installed such that the washing fluid is supplied to an upstream side of the flow controller in the liquid source feed passage without passing through the testing unit; and a second washing fluid feed passage connected to the liquid source feed passage and, at the same time, having a part where the testing unit is placed, the second washing fluid feed passage being installed such that the washing fluid is supplied to an upstream side of the flow controller in the liquid source feed passage through the testing unit.

Further, in the processing device of the present invention, at least a portion of the first washing fluid feed passage may be shared with at least a portion of the second washing fluid feed passage. Further, the processing device of the present invention may include a flow adjuster installed at a part of the first washing fluid feed passage not shared with the second washing fluid feed passage. Still further, the processing device of the present invention may include a flow adjuster installed at an upstream side of the testing unit in said at least the portion of the first washing fluid feed passage shared with the second washing fluid feed passage.

Meanwhile, in case where at least a portion of the first washing fluid feed passage is shared with at least a portion of the second washing fluid feed passage, it is preferable that the processing device includes a common washing fluid feed source for feeding the washing fluid to the first and the second washing fluid feed passage.

Further, there may be no shared part in the first and the second washing fluid feed passage. In this case, two washing fluid feed sources may be installed.

In accordance with still another aspect of the present invention, there is provided a processing device, including: a processing vessel in which a process is performed on an object to be processed by using a liquid source; a liquid source feed passage installed so as to supply the liquid source into the processing vessel from a liquid source feed source; a flow controller for controlling a flow rate of the liquid source flowing through the liquid source feed passage, wherein the flow controller includes a flow detection unit, a flow control valve, and a controller for adjusting opening ratio of the flow control valve such that a flow rate of a fluid detected by the flow detection unit becomes a target flow rate; a memory unit for storing a relationship between the data related to the target flow rate and that related to the opening ratio of the flow control valve for a case where the flow controller properly operates; and a determination unit for determining whether the flow controller properly operates or not on the basis of a comparison result of the relationship stored in the memory unit with a relationship between the data related to the target flow rate and that related to the opening ratio of the flow control valve in case where the flow controller is actually operated.

In accordance with still another aspect of the present invention, there is provided a method of maintaining a processing device in which a liquid source is supplied into a processing vessel through a flow controller installed at a liquid source feed passage, the method including the steps of: flowing a washing fluid to the flow controller through a testing unit having at least one of a function for measuring a flow rate of the washing fluid and that for controlling the flow rate of the washing fluid at a target flow rate; comparing a target flow rate of the washing fluid set in the flow controller with an actual flow rate of the washing fluid measured by the testing unit in case of flowing the washing fluid to the flow controller through the testing unit, or comparing an actual flow rate of the washing fluid measured by a flow sensor prepared in the flow controller with a target flow rate set in the testing unit in case of flowing the washing fluid to the flow controller through the testing unit; and determining whether the flow controller properly operates or not on the basis of the comparison.

In accordance with still another aspect of the present invention, there is provided a method of maintaining a processing device in which a liquid source is supplied into a processing vessel through a flow controller installed at a liquid source feed passage, the method including: cleaning process for cleaning the liquid source feed passage by flowing a washing fluid to the liquid source feed passage at a first flow rate; and testing process for testing the flow controller by flowing the washing fluid to the flow controller at a second flow rate, wherein the testing process includes the steps of, flowing the washing fluid to the flow controller through a testing unit having at least one of a function for measuring a flow rate of the washing fluid and that for controlling a flow rate of the washing fluid at a target flow rate, comparing a target flow rate of the washing fluid set in the flow controller with an actual flow rate of the washing fluid measured by the testing unit in case of flowing the washing fluid to the flow controller through the testing unit, or comparing an actual flow rate of the washing fluid measured by a flow sensor prepared in the flow controller with a target flow rate of the washing fluid set in the testing unit in case of flowing the washing fluid to the flow controller through the testing unit, and determining whether the flow controller properly operates or not on the basis of the comparison.

DETAILED DESCRIPTION OF THE PREFERRED EMBODIMENT

Figure 1:
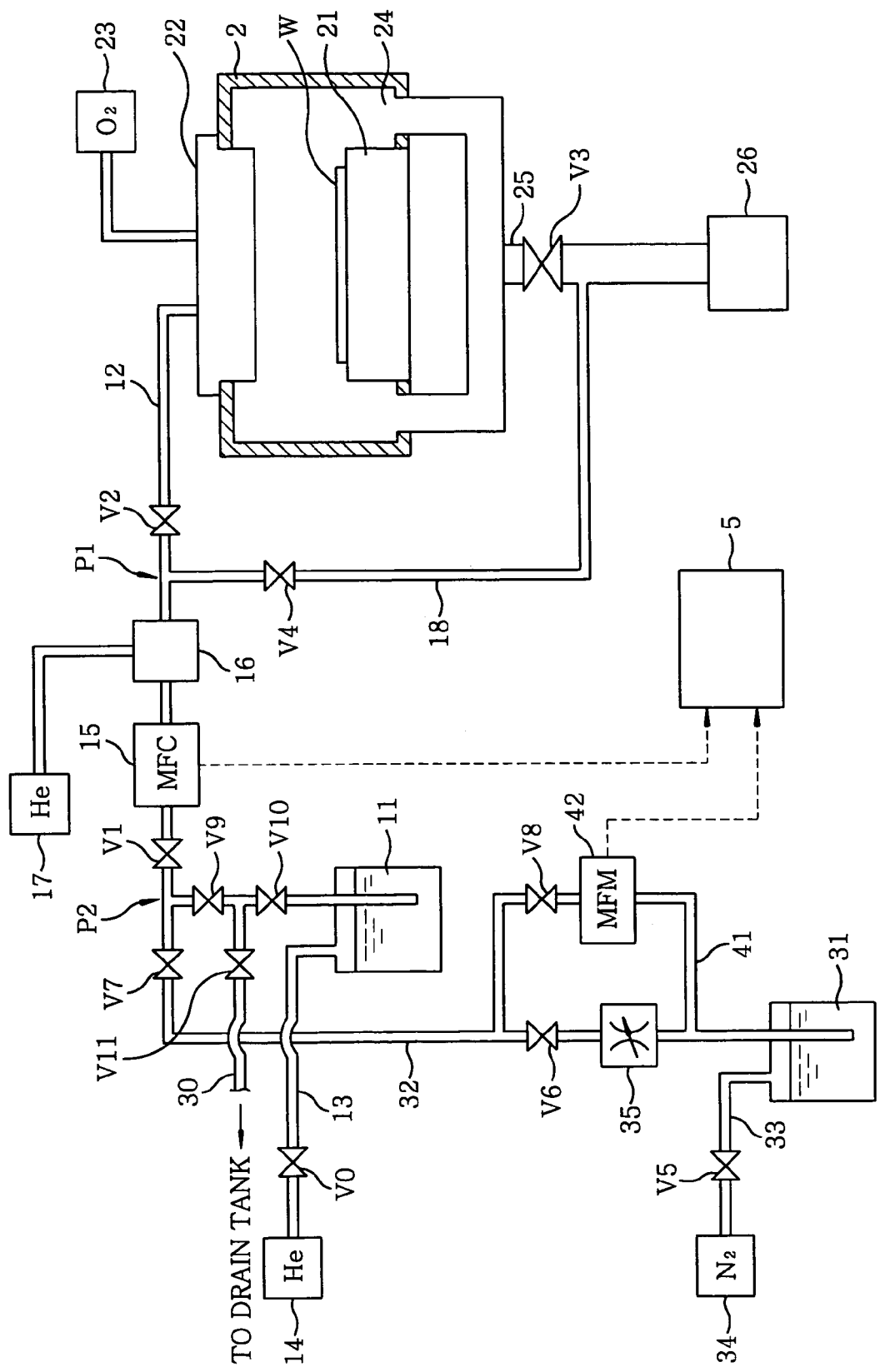
FIG. 1 is a drawing of the total configuration of a processing device in accordance with a preferred embodiment of the present invention.

FIG. 1 is a preferred embodiment of a processing device in accordance with the present invention, and is a view of a substrate processing device for forming a tantalum oxide film ($Ta_2O_5$) on a surface of a semiconductor wafer (hereinafter refer to as wafer) W. In FIG. 1, reference numeral 11 indicates a liquid source tank (liquid source feed source) where tantalum pentaethoxide [$Ta(OC_2H_5)_5$: hereinafter abbreviated as "PET"] of a liquid source, which is used as a raw material for film forming gas, is stored. The liquid source tank 11 is connected to a processing vessel 2, in which a film forming process (gas process) is carried out on the wafer W, through a liquid source feed passage 12 made of a piping.

The liquid source tank 11 is connected to a He gas supply unit 14 through a gas line 13 and a valve V0, and the He gas sent into the liquid source tank 11 from the He gas supply unit 14 drives PET in the liquid source tank 11 to the liquid source feed passage 12. He gas has a low solubility in PET. As a result, when PET is vaporized in a vaporizer 16, it does not occur that dissolved He gas in PET would vaporize and suddenly expand by the heat from a heater to disturb the control of PET flow rate. Based on this advantage, He gas is used preferably but another gas species can be used instead.

Along the liquid source feed passage 12, the equipment are installed in the following order from the upstream: valves V10, V9, and V1, a mass flow controller (hereinafter refer to as "MFC") 15, which is a liquid flow controller, a vaporizer 16, and a valve V2.

While the MFC 15 is an integrated unit, which includes a flow control valve, a flow sensor (flowmeter), and a controller (all of which are not shown in FIG. 1), the controller regulates the opening ratio of the flow control valve on the basis of a set flow rate (i.e., a target flow rate set in the MFC 15) and a reading from the flow sensor. Since the PET flow rate when forming a tantalum oxide film is a very small amount such as about 0.2 cc/minute, the MFC 15 employed is capable of controlling the flow rate in the range of 0.10 cc/minute to 0.50 cc/minute.

Instead of installing the MFC 15 as an integrated unit, the mass flow controller can be composed so that the flow control valve, the flow sensor, and the controller, are individually provided. For example, it is possible to install a mass flow meter already including a controller instead of the MFC 15 and to install inside the vaporizer 16 a flow control valve whose opening ratio is controlled by the corresponding controller.

A carrier gas supply source 17 for supplying a carrier gas such as He gas is connected to the vaporizer 16. In the vaporizer 16, the carrier gas is heated to about 160° C. by a built-in heater which is not shown. PET is sent into an actuator (not shown) inside the vaporizer 16 with heated carrier gas, is vaporized therein, and is sent to the processing vessel 2 as a film forming gas.

In the processing vessel 2, a mounting table 21 for mounting the wafer W is disposed. In the mounting table 21, a heater (not shown) for heating the wafer W from the rear side during the film forming process is installed. On a ceiling of the processing vessel 2, a shower head 22 having multiple holes (not shown) in its lower part is disposed. The shower head 22 supplies both a film forming gas, which is sent through the aforementioned liquid source feed passage 12, and an oxygen ($O_2$) gas supplied from an oxygen gas supply unit 23, towards the wafer W mounted on the mounting table 21.

An exhaust port 24 is disposed in a bottom portion of the processing vessel 2, and the portion is connected to an exhaust line 25 made of a piping. The other end of the exhaust line 25 is connected to a vacuum pump (exhaust means) 26. A valve V3 is installed in the exhaust line 25, and a bypass passage 18, which is branched from a junction node P1 between the vaporizer 16 and the valve V2, is connected between the valve V3 of the exhaust line 25 and the vacuum pump 26. The bypass passage 18 is utilized when cleaning the liquid source feed passage 12.

A valve V4 is installed in the bypass passage 18, and a flowing path of a fluid can be changed in the downstream of the junction node P1, by working with and switching valves V2 and V4.

Subsequently, the part that is operated for cleaning the liquid source feed passage 12 and the MFC 15 test is explained.

In FIG. 1, reference numeral 31 is a washing fluid tank (washing fluid feed source), in which a washing fluid such as ethanol ($C_2H_5OH$) for washing down PET inside the liquid source feed passage 12 is stored. Since ethanol is hydrophilic, by passing it through a new piping system or a reconnected piping system after maintenance and repair, it is possible to remove moistures remaining on an inner wall of the piping. Although ethanol tends to contain moisture, it is preferable that the water content of ethanol is maintained 1000 ppm or less. The washing fluid is not limited to ethanol so that an organic solvent such as another alcohol species, acetone, or the like may be used. The washing fluid is not necessarily limited to hydrophilic substances and it may be a hydrophobic liquid chemical, for example, hexane or octane.

A washing fluid feed passage 32 is extended from a washing fluid tank 31, and is connected to the liquid source feed passage 12 at a point (junction node P2) between the valves V1 and V9. The washing fluid tank 31 is connected to a nitrogen ($N_2$) gas supply source 34 through a gas supply line 33. By opening a valve V5 installed in the gas supply line 33, the washing fluid in the washing fluid tank 31 is pushed to the washing fluid feed passage 32 by a pressure of nitrogen gas, thereby moving towards the liquid source feed passage 12.

Along the washing fluid feed passage 32, beginning from the washing fluid tank 31 side, a needle valve 35, which is a flow controller of the washing fluid, and valves V6 and V7 are installed in that order. Further, a discharge line 30 branches out between the valves V9 and V10 of the liquid source feed passage 12. The discharge line 30 is connected to a drain tank (not shown) through a valve V11. The discharge line 30 is used when cleaning the liquid source feed passage 12.

To the washing fluid feed passage 32, a bypass passage 41 that bypasses the section where the needle valve 35 and the valve V6 are installed in the washing fluid feed passage 32, is connected. In the bypass passage 41, from the upstream, a mass flow meter (hereinafter refer to as "MFM") 42 used as a testing unit and a valve V8, are installed in that order. By interchanging the valves V6 and V8, it is possible to selectively send the washing fluid to either the section where the needle valve 35 of the washing fluid feed passage 32 is installed or the bypass passage 41 in which the MFM is installed. Namely, in the processing device, a first washing fluid feed passage, which starts from the washing fluid tank 31 and connects to the liquid source feed passage 12 through the needle valve 35, and a second washing fluid feed passage, which shares a part of the first washing fluid feed passage, and starts from the washing fluid tank 31 and connects to the liquid source feed passage 12 through the MFM 42, are installed.

The needle valve 35 is used for adjusting the flow rate of the washing fluid when cleaning the liquid source feed passage 12 and/or the equipment such as MFC 15 installed in the liquid source feed passage 12. The needle valve 35 is adjusted to allow the washing fluid at a rate of about 5 cc/minute. Since it is not necessary to precisely regulate the flow rate of the washing fluid during cleaning, the flow controller of the washing fluid need not have the capability to monitor and to automatically control the fluid flow rate through the controller so that it is sufficient as long as the flow controller is capable of manually adjusting the flow rate roughly. In the present embodiment, while the needle valve 35 is used as an inexpensive flow controller satisfying such demand, another type of flow controller may be used.

Since the MFM 42 is installed for testing the MFC 15, it has a measurement range corresponding to the aforementioned flow control range of the MFC 15, for example, from 0.10 cc/minute to 0.50 cc/minute. It is preferable that the reading (sensing) accuracy of the MFM 42 is substantially equal to or greater than that of the MFC 15. Further, another type of flowmeter may be used provided that its flow rate reading accuracy is just as good.

The maximum flow rate of the washing fluid through the MFM 42, which has a reading range of 0.10 cc/minute to 0.50 cc/minute described above, is smaller than a desirable flow rate of the washing fluid for cleaning (in the present embodiment, about 5 cc/minute). Therefore, the bypass passage 41 bypassing the MFM 42 is installed so that a large amount of the washing fluid desired for cleaning can run through.

The MFC 15 and the flowmeter 42 are connected to a computer 5. The computer 5 is preferably set up as a part of a system controller (not shown), which controls the overall operation of the processing device. The computer 5 monitors the proper operation of MFC 15, on the basis of a set flow rate of the MFC 15 or a flow rate detected by a built-in flow sensor of the MFC 15, and a flow rate measured by the MFM 42, when running the washing fluid to the MFC 15 through the bypass passage 41. Further, the computer 5 has a display function to indicate in a display unit (not shown) that the MFC 15 is proper when it determines that the MFC 15 is properly operating. On the other hand, the computer 5 displays in the display unit (not shown) that the MFC 15 is improper when the operation of the MFC 15 is determined to be improper. Still further, the computer 5 may have a function to signal an alarm when the MFC 15 is determined to be improper and a function to transmit a signal for preventing starting of a film forming process.

Next, the operation is discussed. First, the film forming process is discussed briefly. The wafer W is loaded onto the mounting table 21 through a gate valve (not shown), which is installed at the side portion of the processing vessel 2. The vacuum pump 26 operates and the inside of the processing vessel 2 is maintained at a predetermined vacuum level by adjusting the opening ratio of the valve V3. The wafer W is heated by a heater (not shown), which is installed in the mounting table 21, whereby the wafer W's surface temperature reaches a predetermined processing temperature. Under this condition, when PET vapor and oxygen gas are delivered onto the wafer W through the shower head 22, a tantalum oxide ($Ta_2O_5$) film is formed over the entire surface of the wafer W by a chemical vapor deposition mechanism. At this time, the aforementioned system controller (not shown) adjusts the flow rate of PET running through the inside of the liquid source feed passage 12 to a predetermined flow, e.g., 0.12 cc/minute, by the MFC 15, and adjusts the flow rate of the oxygen gas to a predetermined flow rate by a gas flow controller (not shown).

As a result of repeatedly performing the film forming process to consume PET, if the tank 11 becomes empty, it is replaced. The replacement procedure is carried out in the following manner: the upstream piping from the valve V10 of the liquid source feed passage 12 is disconnected, and a piping equipped with a new tank 11 is connected to the valve V10. Prior to this replacement procedure, the inside of the piping located downstream of the valve V10 is cleaned to remove PET.

When performing the cleaning, the valve V8 is closed, the valve V6 is opened, and the needle valve 35 is adjusted to supply the washing fluid at a flow rate of about 5 cc/minute. At this time, by closing the valves V1 and V10, and opening the valves V7, V9, and V11, the washing fluid would clean the area between the valve V1 of the liquid source feed passage 12 and the valve V10 to remove PET therein, and thereafter, the washing fluid with PET is discharged to a drain tank (not shown) through a discharge line 30. Further, since it is not necessary to exactly control the flow rate of the washing fluid during cleaning as described above, the flow rate control of the washing fluid is conducted by manually adjusting the opening ratio of the needle valve 35, based on experiences.

Figure 2:
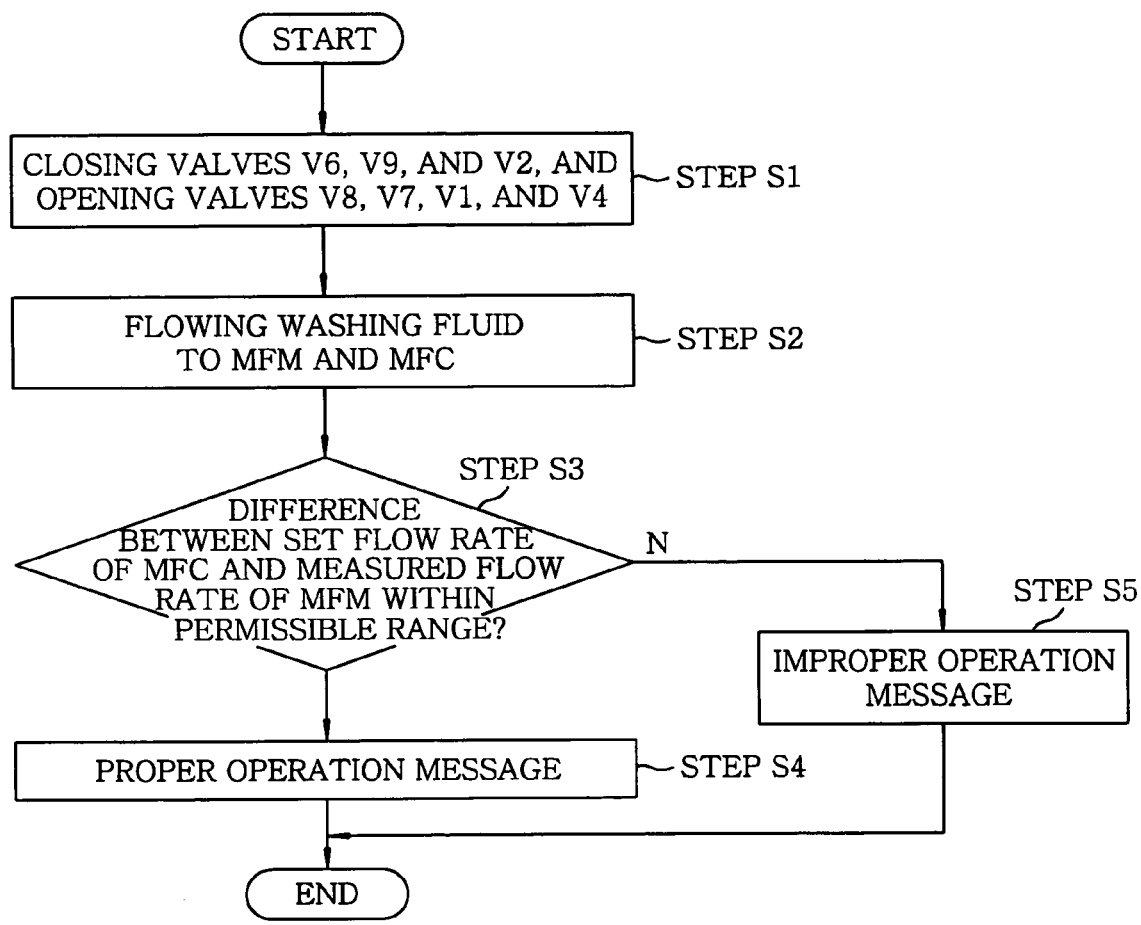
FIG. 2 shows a flowchart that describes the correction sequence of a mass flow controller in the processing device of FIG. 1, in accordance with a method of the present invention.

Subsequently, the MFC 15 testing is performed as follows. First, the valves V6, V9, and V2 are closed, and the valves V8, V7, V1, and V4 are opened (step S1 of FIG. 2). Thereafter, the valve V5 is opened to supply the washing fluid into the washing fluid feed passage 32. The corresponding washing fluid runs through the MFC 15 via the MFM 42, vaporizes in the vaporizer 16, and is exhausted through the bypass passage 18 (step S2). At this time, the flow rate of the washing fluid is set to a flow rate within a range controllable by the MFC 15, e.g., a flow rate (0.12 cc/minute) corresponding to that of PET in film forming. The computer 5, by comparing the set flow rate of the MFC 15 (target flow rate preset in the MFC 15) with a flow rate measured by the MFM 42, determines whether both flow rates match, for example determines whether the difference of the flow rates is within a permissible range (for example, within the permissible range of measurement error in the device) or not (step S3). If the result is within the permissible range, the washing fluid is running at a set flow rate in the MFC 15, so that the MFC 15 operates properly, in this case, a message is displayed as proper in a display unit such as a monitor (not shown) (step S4). However, if the result is outside the permissible range, the washing fluid is not running at a set flow rate in the MFC 15, so that the computer 5 displays an improper operation message (step S5), and for example, an alarm is activated.

In case the message indicates an improper operation, it is highly likely that solidified PET is attached inside the MFC 15 so that the MFC 15 is replaced with a new one.

When replacing the MFC 15, the liquid source feed passage 12 is disassembled, and each part thereof contacts with the air. As a result, there is a concern that PET on the parts would react with moisture in the air as described above, and solidify. Therefore, before and after the disassembling procedure, cleaning of the liquid source feed passage 12 is performed. In the procedure, the valves V6 and V8 are interchanged, and the washing fluid is supplied to the liquid source feed passage 12 through the needle valve 35. Further, at this time, a signal is given for the MFC 15 that the opening ratio of the built-in flow control valve of the MFC 15 is fully open. Accordingly, it is possible to run the washing fluid into the MFC 15 with a flow rate greater than the flow control range when the MFC 15 is properly operating.

In the aforementioned embodiment, the MFM 42 is installed in the washing fluid feed passage 32, the washing fluid flows into the MFC 15, which controls the flow rate of the liquid source, and the MFC 15 testing is performed by comparing the set flow rate of the MFC 15 with the measured flow rate of the MFM 42. Therefore, the MFC 15 testing can be performed without separating it. As a result, it is possible to avoid such a risk that moisture in the air and PET would react when detaching and attaching the MFC 15.

Further, in the aforementioned embodiment, a bypass passage 41 is connected to the washing fluid feed passage 32, in which the MFM 42 used in the MFC testing 15 is installed. Thus, fast cleaning can be performed by sending a large amount of washing fluid when cleaning, whereas when conducting the MFC 15 testing, a small amount of the washing fluid, corresponding to that of the liquid source when film forming, is sent.

Figure 3:
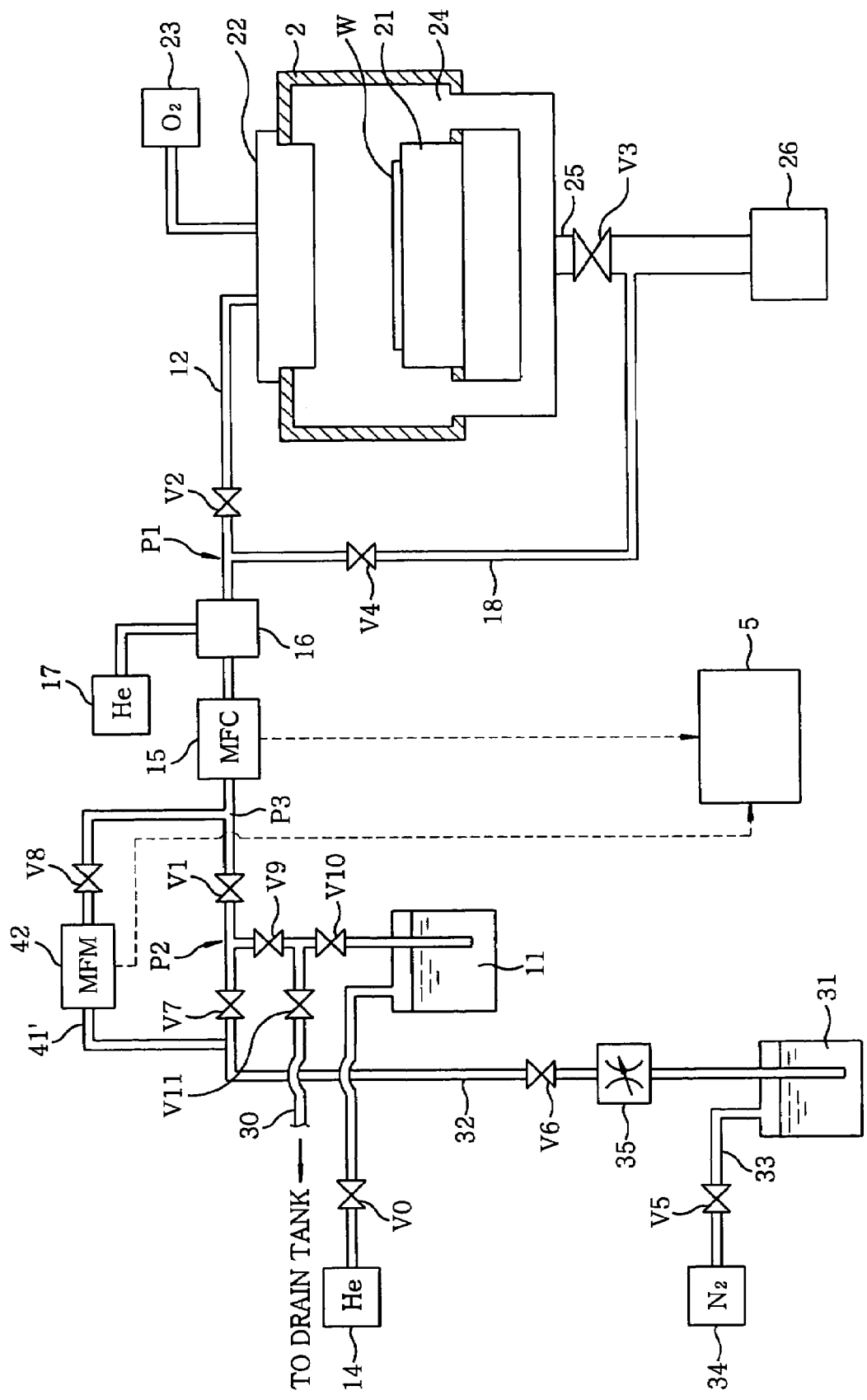
FIG. 3 is a drawing of the total configuration of a processing device in accordance with another preferred embodiment of the present invention.

Still further, the arrangement of the bypass passage is not limited to the configuration of FIG. 1, but the bypass passage can be arranged as illustrated in FIG. 3. In a preferred embodiment shown in FIG. 3, one end of a bypass passage 41' is connected to the upstream of the valve V7 in the washing fluid feed passage 32, and the other end is connected to the junction node P3 between the valve V1 of the liquid source feed passage 12 and the MFC 15. In this case, in the processing device, there are installed a first and a second washing fluid feed passage, wherein the first washing fluid feed passage is connected to the junction node P2 of the liquid source feed passage 12 through the needle valve 35 from the washing fluid tank 31, and wherein the second washing fluid feed passage shares a part with the first washing fluid feed passage, and, at the same time, is connected to the junction node P3 of the liquid source feed passage 12 through the needle valve 35 and the MFM 42 from the washing fluid tank 31. In this case, the washing fluid can be supplied by any one of the first and the second washing fluid feed passage, by properly interchanging the valves V7, V8, and V1.

Figure 4:
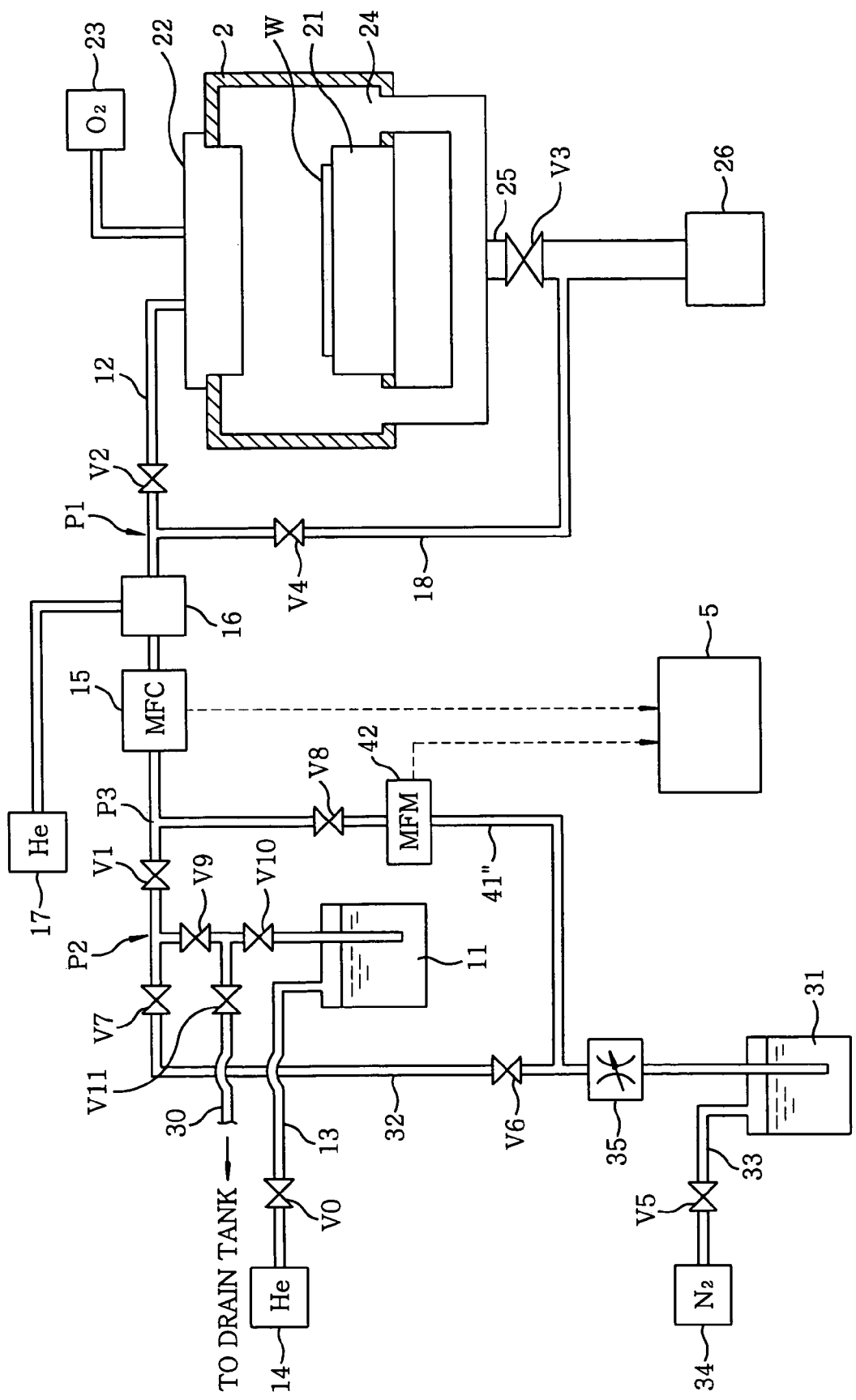
FIG. 4 shows a view of the total configuration of a processing device in accordance with still another preferred embodiment of the present invention.

Still further, the bypass passage can be arranged, as illustrated in FIG. 4. In a preferred embodiment shown in FIG. 4, one end of a bypass passage 41" is connected between the valve V6 of the washing fluid feed passage 32 and the needle valve 35, and the other end is connected to the junction node P3 between the valve V1 of the liquid source feed passage 12 and the MFC 15. In this case, in the processing device, there are installed a first and a second washing fluid feed passage, wherein the first washing fluid feed passage is connected to the junction node P2 of the liquid source feed passage 12 through the needle valve 35 from the washing fluid tank 31, and wherein the second washing fluid feed passage shares a part with the first washing fluid feed passage, and, at the same time, is connected to the junction node P3 of the liquid source feed passage 12 through the needle valve 35 and the MFM 42 from the washing fluid tank 31. In this case, the washing fluid can be supplied selectively by the first or the second washing fluid feed passage, by properly interchanging the valves V6, V7, V8, and V1.

Figure 11:
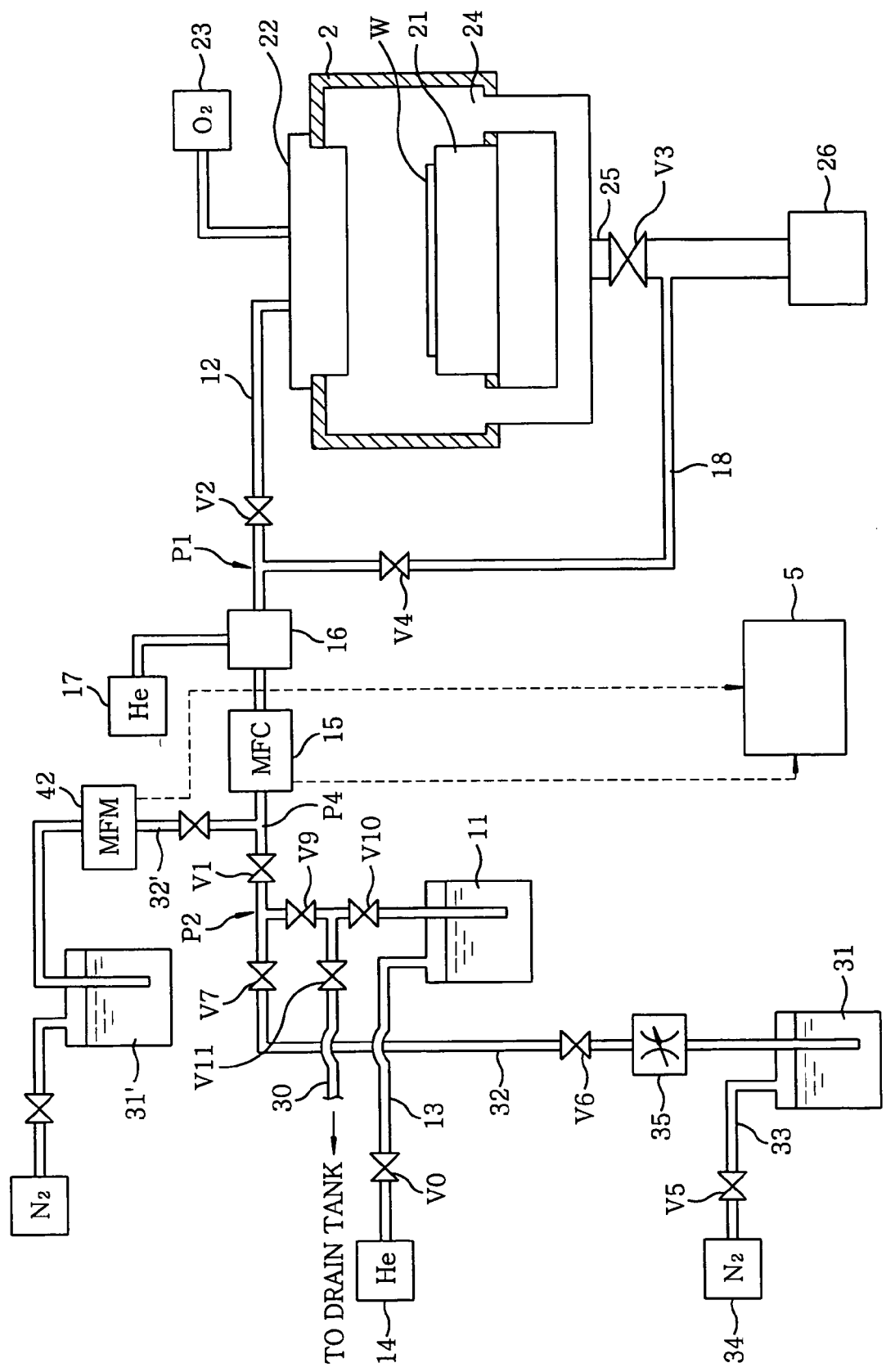
FIG. 11 shows a view of the total configuration of a processing device in accordance with still another preferred embodiment of the present invention.

Still further, as described in FIG. 11, two washing fluid tanks 31 and 31' may be installed. In this case, in the processing device, there are installed a first and a second washing fluid feed passage, wherein the first washing fluid feed passage 32 is connected to the junction node P2 of the liquid source feed passage 12 through the needle valve 35 from the washing fluid tank 31, and wherein the second washing fluid feed passage 32' is connected to a junction node P4 of the liquid source feed passage 12 through the MFM 42 from the washing fluid tank 31' at the same time while the second passage does not share any part with the first washing fluid feed passage.

Figure 12:
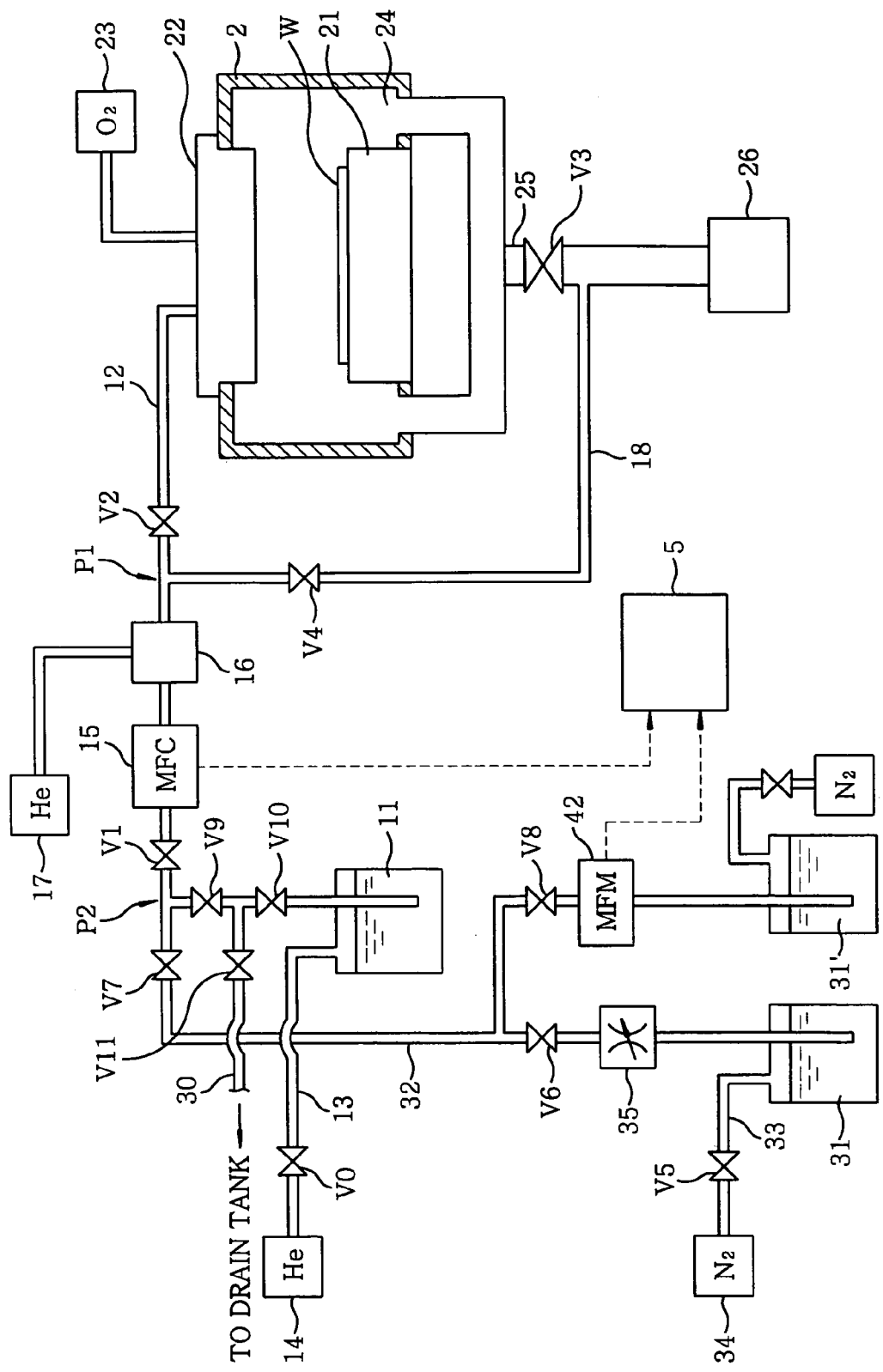
FIG. 12 shows a view of the total configuration of a processing device in accordance with still another preferred embodiment of the present invention.

Still further, as illustrated in FIG. 12, two washing fluid tanks 31 and 31' can be installed. In this case, in the processing device, there are installed a first and a second washing fluid feed passage, wherein the first washing fluid feed passage is connected to the junction node P2 of the liquid source feed passage 12 through the needle valve 35 from the washing fluid tank 31, and wherein the second washing fluid feed passage shares a part with the first washing fluid feed passage, and at the same time, is connected to the junction node P2 of the liquid source feed passage 12 through the MFM 42 from the washing fluid tank 31'.

Figure 5:
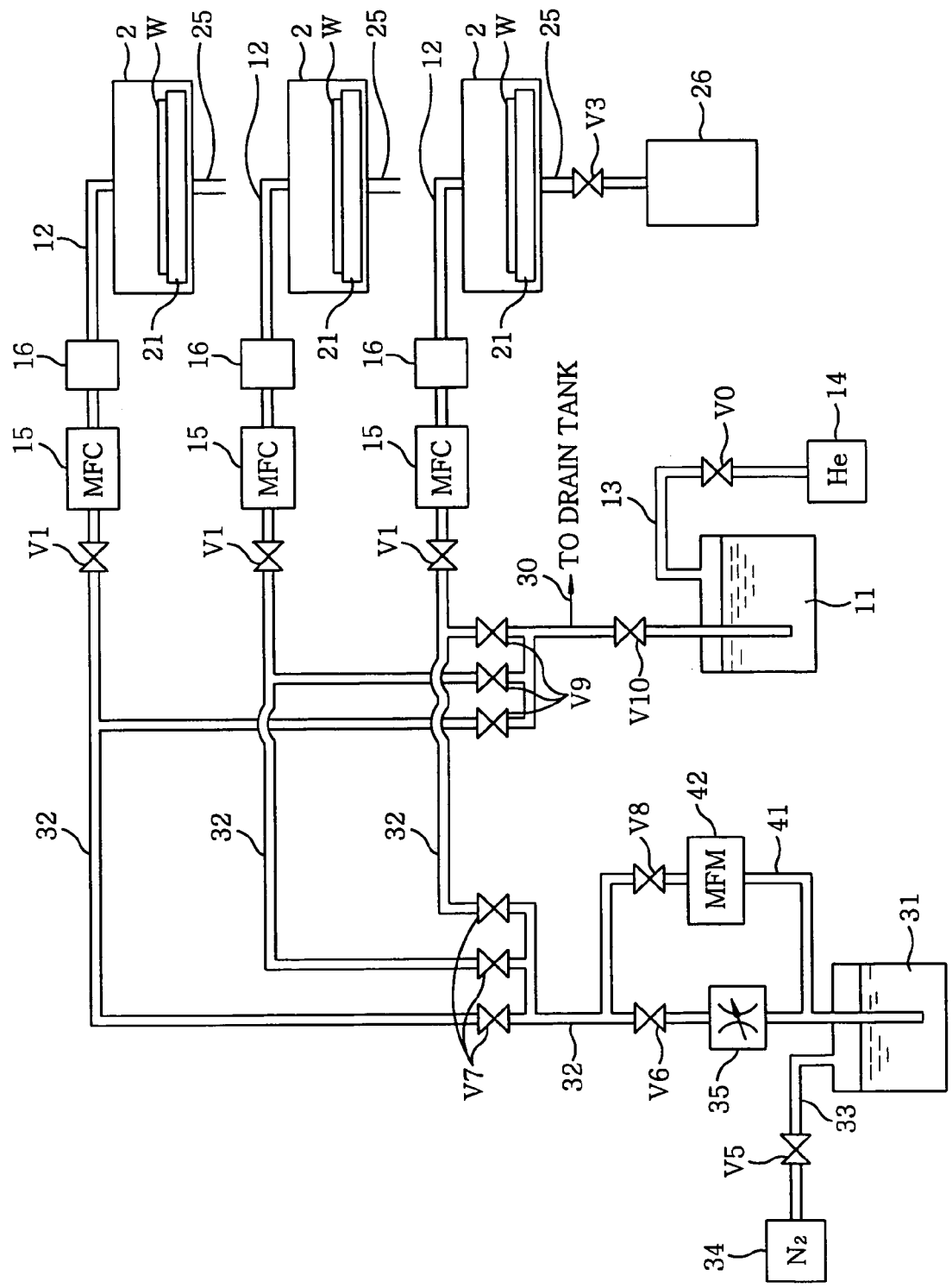
FIG. 5 shows a view of the total configuration of a processing device in accordance with still another preferred embodiment of the present invention.

The aforementioned configuration can be applied to such a processing device that the common liquid source tank 11 and the washing fluid tank 31 are installed for a plurality of processing vessels as illustrated in FIG. 5. A preferred embodiment shown in FIG. 5 is based on that of FIG. 1, and corresponds to such a configuration that the liquid source feed passage 12 is split into three branches in the upstream of the valve V9, and, at the same time, the washing fluid feed passage 32 is split into three branches in the upstream of the valve V7. In the preferred embodiment shown in FIG. 5, by opening the valve V7 corresponding to the MFC 15, which is the object to be calibrated, the MFC 15 can be calibrated as desired by using the MFM 42 that is a common testing unit. Further, for simplification of the drawing in FIG. 5, some units (bypass passage 18, discharge line 25, valve V3, and vacuum pump 26) disposed in the lower side of the valve V1 have been omitted, but they are set up in practice for each processing vessel, as described in FIG. 1.

As for the testing unit, a flow controller may be used instead of the MFM 42 (flowmeter equipment) used in the aforementioned embodiment. In this case, a flow controller of which flow control range overlaps with that of the MFC 15 for liquid source can be used, for example the same type as MFC 15. The MFC 15 test may be performed by determining whether a detection value of the built-in flow sensor of the MFC 15 matches with a set flow rate of the testing MFC, or reversely, by determining whether a detection value of the built-in flow sensor of the testing MFC matches with a set flow rate of the MFC 15.

Figure 6:
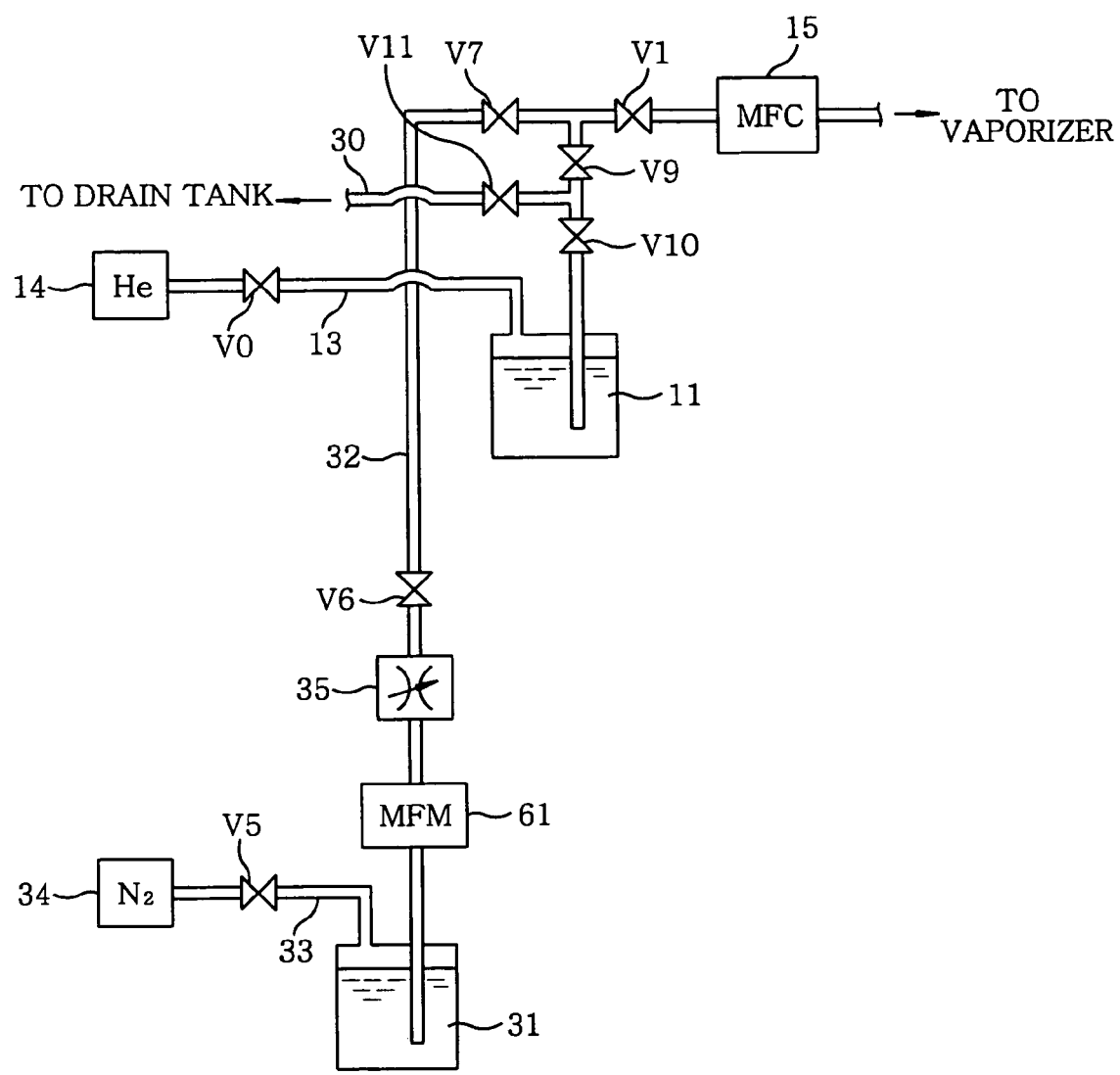
FIG. 6 shows a view of a configuration of the main part a processing device in accordance with still another preferred embodiment of the present invention.

In this case, a testing MFC 61 may be installed in the upstream of the needle valve 35 in the washing fluid feed passage 32, as described in FIG. 6, without installing the bypass passages 41, 41', and 41". From the consideration of enhancing the cleaning efficiency, it is preferable that the MFC 61 can permit a flow rate of the washing fluid with an amount greater than a controllable range when properly operating, by fully opening its built-in flow control valve. In case an MFC that cannot permit a flow rate of the washing fluid more than its controllable range when properly operating is used, cleaning is performed with a flow rate within its corresponding controllable range. In case of the arrangement illustrated in FIG. 6, the flowmeter equipment such as a mass flow meter may be used instead of the MFC 61, but the flow rate of the washing fluid becomes limited by the maximum flow rate permissible by the corresponding flowmeter equipment.

Further, the needle valve 35 may be omitted from the configuration shown in FIG. 6. In this case, the MFC 61 can be used both as a flow controlling unit for the washing fluid during cleaning and as a testing unit.

Next, still another preferred embodiment of the present invention is discussed with reference to FIGS. 7 and 8. As described in FIG. 7, the MFC 15 includes a flow detection unit (flow sensor) 71, a controller 72 for comparing a flow rate detected in the flow detection unit 71 with a set flow rate and outputting an operation signal based on the discrepancy thereof, and a flow control valve 74 of which opening ratio is adjusted by an actuator 73 based on the operation signal. Reference numeral 8 indicates a computer, and it has a memory unit 81 and a determination means 82. In the memory unit 81, the following two types of data are stored: the data corresponding to a set flow rate of the MFC 15 when the washing fluid is sent to the MFC 15 operating properly (for example, a data representing a set flow rate of the MFC 15, or a data corresponding to a control signal for setting a set flow rate of the MFC 15 sent from the aforementioned system controller to the MFC 15) and the data corresponding to an opening ratio, which corresponds to the set flow rate (for example, a data corresponding to a signal representing a shift of the actuator 73, or a data representing a control voltage of the actuator 73). In a preferred embodiment shown in FIG. 7, the entire configuration of the processing device may be the same as that of FIG. 1, except that the bypass passage 41, MFM 42, and valve V8 are not installed.

In case of testing the MFC 15, a set flow rate of the MFC 15 is adjusted to the same value as that of the memory unit 81 as a flow rate of the washing fluid of the MFC 15. The computer 8 collects the data corresponding to the actual opening ratio of the valve at that time (here, a signal representing a shift of the actuator 73), compares in the determination means 82 whether the data corresponding to the opening ratio of the valve stored in the memory unit 81 matches with the collected data, and determines whether the MFC 15 is properly operating or not on the basis of the comparison.

Figure 8:
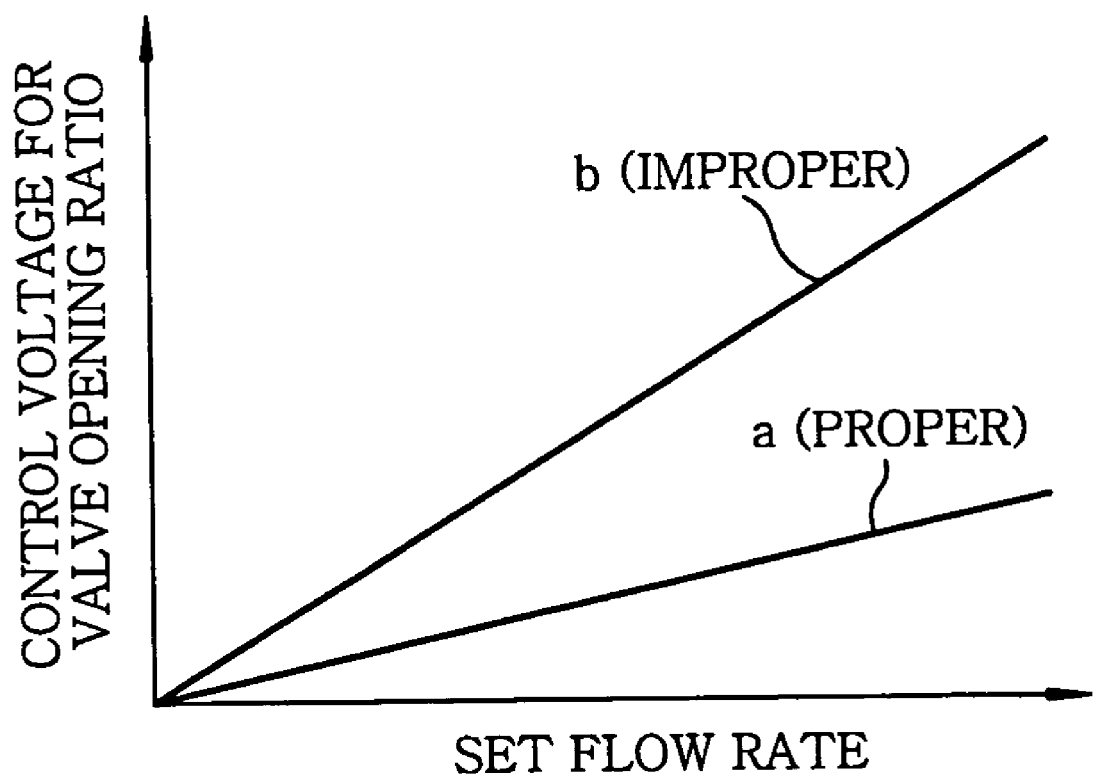
FIG. 8 is a graph that schematically shows a relationship between a set flow rate of a mass flow controller and a control voltage for the valve opening ratio.

FIG. 8 is a graph for illustrating a relationship between set flow rates of the MFC 15 and valve control voltages corresponding to valve opening ratios, wherein a solid line (a) indicates a case where the MFC 15 is properly operating. If PET attaches to a part involved with flow detection of the MFC 15, the flow detection sensitivity becomes imprecise. In case where the washing fluid is running at 0.2 cc but only a detection value of 0.1 cc can be obtained, the opening ratio becomes large, so that even with the same set flow rate, the slope becomes steeper, as shown by the solid line (b). Therefore, it is possible to determine whether the MFC 15 is properly operate or not, by comparing an actual opening ratio value with a stored value of the opening ratio. In carrying out such a method, a function (for example, the solid line (a) shown in FIG. 8) for showing a relationship between a predetermined set flow and a signal for the opening ratio of the valve is obtained in advance, and it may be determined whether the set flow during testing and the actual opening ratio of the valve are consistent with the function or not.

Figure 7:
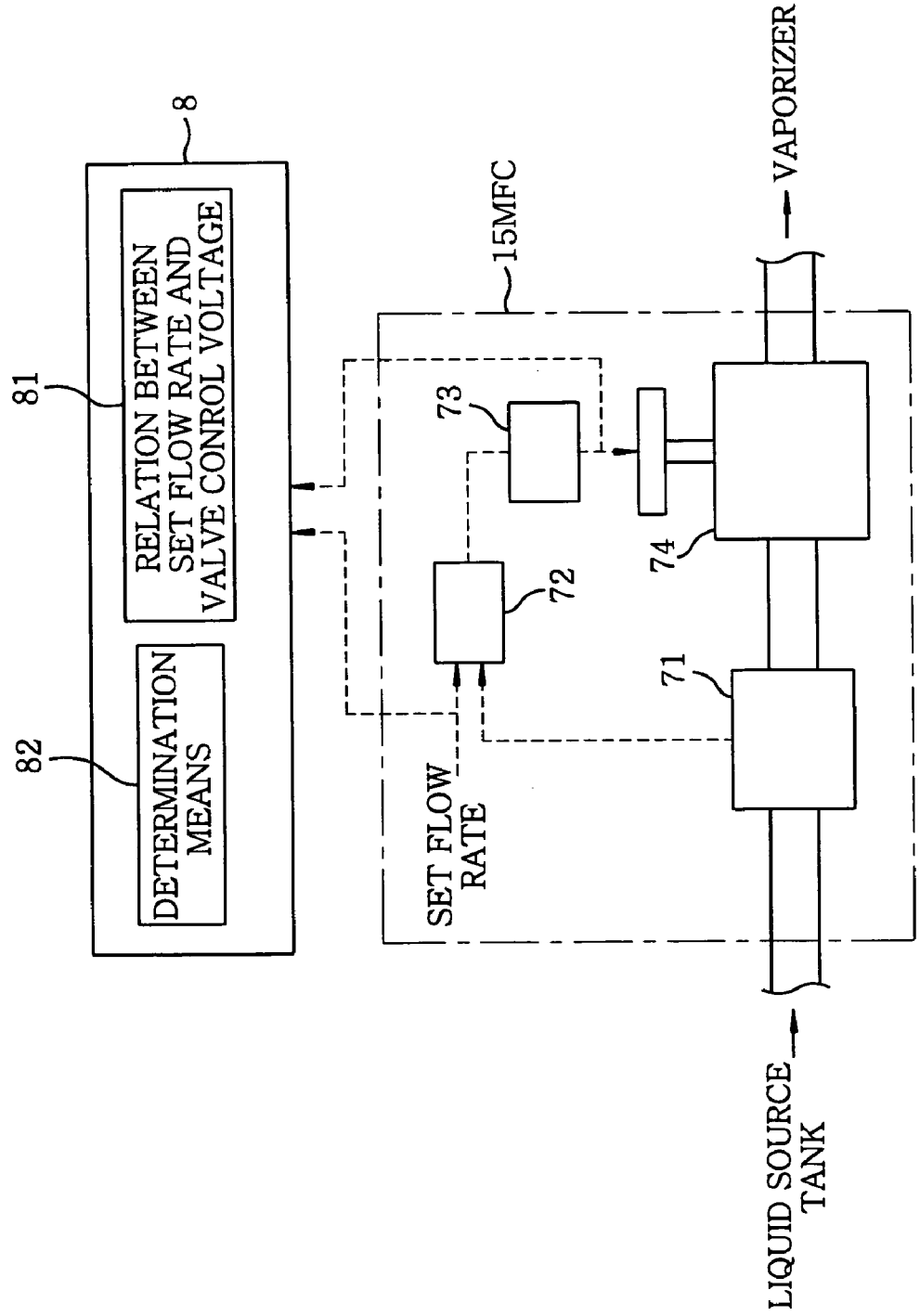
FIG. 7 shows a view of a configuration of the main part a processing device in accordance with still another preferred embodiment of the present invention.

In accordance with the preferred embodiment shown in FIG. 7, it is possible to calibrate the MFC 15 without separating it, even when the testing unit is not installed in the washing fluid feed passage 32.

Figure 9:
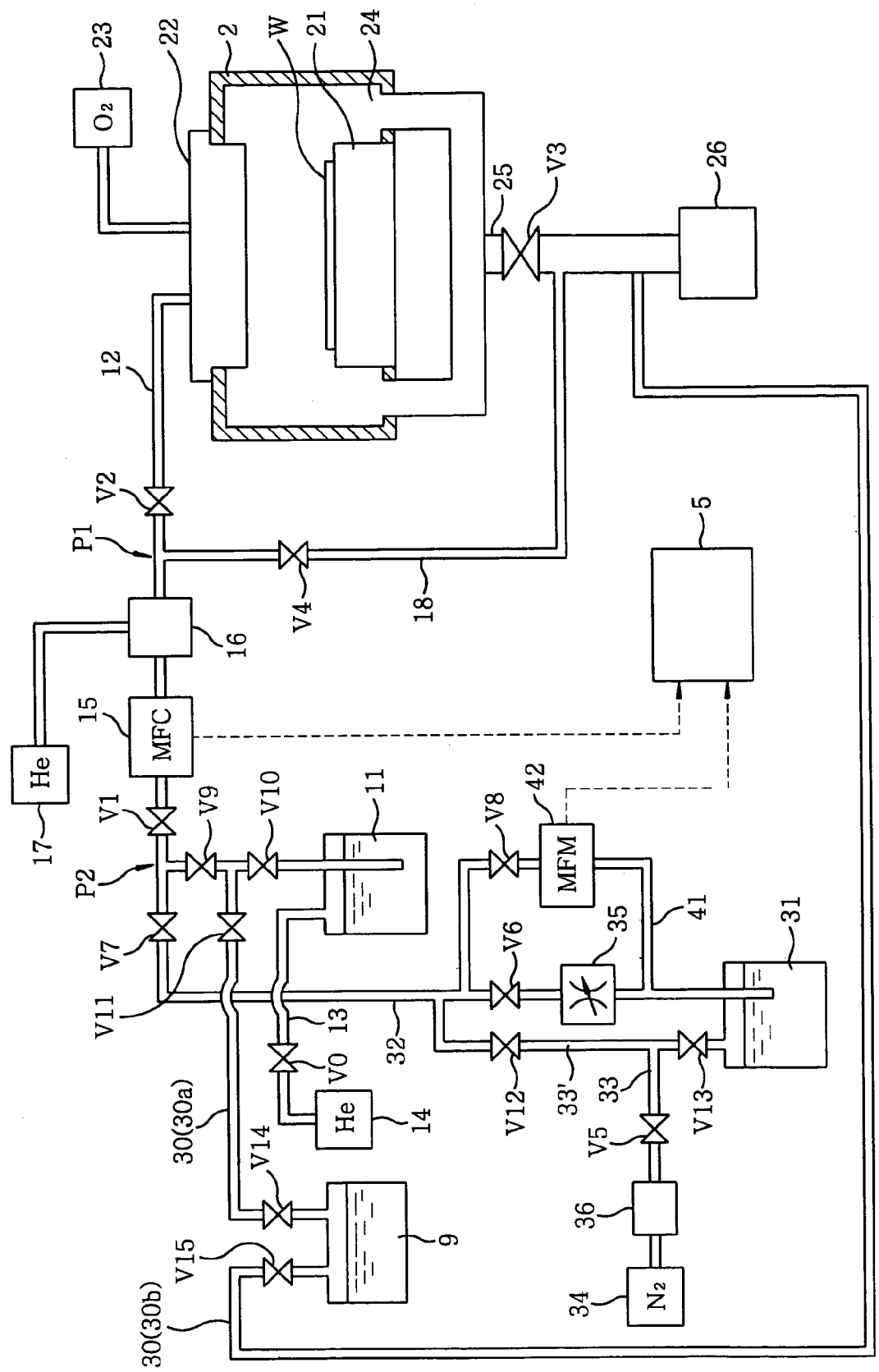
FIG. 9 shows a view of the total configuration of a processing device in accordance with still another preferred embodiment of the present invention.

Next, still another embodiment of the present invention will be explained with reference to FIG. 9. A processing device shown in FIG. 9 is different from that of FIG. 1, as follows.

(1) A branch line 33' is connected to the gas supply line 33 which is for supplying a nitrogen gas into the washing fluid tank 31 to thereby push the washing fluid while the branch line 33' is connected to at a downstream point of the valve V6 in the washing fluid feed passage 32, and, at the same time, a valve V12 is installed in the branch line 33'.

(2) A valve V13 is installed at a downstream point lower than a position to which the branch line 33' of the gas supply line 33 is connected, and, by interchanging the valves V12 and V13, the following modes are available to be selected: the mode wherein the washing fluid is sent to the washing fluid feed passage 32 by supplying the nitrogen gas into the washing fluid tank 31 side; and the mode wherein the nitrogen gas is directly sent to the washing fluid feed passage 32 by bypassing the washing fluid tank 31.

(3) A pressure controller 36 is installed between the nitrogen gas supply source 34 and the valve V5.

(4) The discharge line 30 branched between the valves V9 and V10 of the liquid source feed passage 12 is extended through the drain tank 9, to be connected to the exhaust line 25 for exhausting the processing vessel 2. The drain tank 9 is made of an airtight container, and, to a top surface thereof, the tank is connected the discharge line 30(30a) from the liquid source feed passage 12 side and the discharge line 30(30b) from the vacuum pump 26 side, through valves V14 and V15, respectively.

Next, in the processing device shown in FIG. 9, a method for cleaning the liquid source feed passage 12 is discussed with reference to FIGS. 9 and 10. The following explanation assumes a case wherein the liquid source feed passage 12 is cleaned before it is opened to the air, when performing maintenance and repair during equipment replacement such as the piping, the MFC 15, or the like, or the liquid source tank 11. First, the valves V2 and V10 of the liquid source feed passage 12 are closed. Then, the valves V9 and V1 between the valves V2 and V10 and the valve V4 of the bypass passage 18 are opened; the valves V13, V6, and V8 are closed; and the valves V5, V12, and V7, and the valves V11, V14, and V15 of the discharge line 30 are opened.

Accordingly, the following two paths are formed: a path for sequentially running the liquid source feed passage 12 and the bypass passage 18 from the nitrogen gas supply source 34 to reach the vacuum pump 26; and a path for sequentially passing the liquid source feed passage 12 and the discharge line 30 from the nitrogen gas supply source 34 to reach the vacuum pump 26. Therefore, the nitrogen from the nitrogen gas supply source 34 flows into the liquid source feed passage 12 through the washing fluid feed passage 32. As a result, PET is sent to the vacuum pump 26 side, and the gas inside the piping is substituted by the nitrogen gas (step S1). In this case, PET remaining in the downstream of the junction node P2 is vaporized in the vaporizer 16 and exhausted through the bypass passage 18. In addition, PET present between the junction P2 and the valve V10 is collected in the drain tank 9 through the exhaust line 30(30a) first, and the nitrogen gas is exhausted through the exhaust line 30(30b).

In case of not installing the drain tank 9, since PET vaporizes in a moment when flow into the exhaust line 25 from the exhaust line 30, the load of the vacuum pump 26 becomes large. However, by installing the drain tank 9, like the preferred embodiment of FIG. 9, a buffer for collecting PET becomes available. Therefore, there is an advantage of making the loading of the vacuum pump 26 small.

Subsequently, the valve V5 of the gas supply line 33 is closed to stop supplying the nitrogen gas, and the pipings in the downstream of the valve V5, i.e., the insides of the washing fluid feed passage 32, the liquid source feed passage 12, and the discharge line 30, are exhausted by the vacuum pump 26 (step S2). Thereafter, the valve V12 in the branch line 33', V11 in the discharge line 30, and V4 of in the bypass passage 18 are closed, and the valves V13 and V6 are opened. Accordingly, the nitrogen gas is supplied into the washing fluid tank 31, whereby the washing fluid is pushed out from here. At this time, since the washing fluid feed passage 32 and the liquid source feed passage 12 are in a depressurized atmosphere, the washing fluid is sent and filled therein (step S3). After 5 seconds to 30 minutes, the same valve operation as that of step S1 is performed, so that there are formed a first and a second fluid path, wherein the first fluid path sequentially runs through the liquid source feed passage 12 and the bypass passage 18 from the nitrogen gas supply source 34 to reach the vacuum pump 26, and wherein the second fluid path sequentially passes the liquid source feed passage 12 and the discharge line 30 from the nitrogen gas supply source 34 to reach the vacuum pump 26. Then, the washing fluid inside the washing fluid feed passage 32 and the liquid source feed passage 12 are sent and discharged by the nitrogen gas (step S4). Thereafter, by continuously flowing the nitrogen gas, the gas inside the piping is substituted by the nitrogen gas (step S5).

Then, the valve V5 of the nitrogen gas supply source 34 side is closed to stop supplying the nitrogen gas, in the same manner as step S2, and the insides of the washing fluid feed passage 32, the liquid source feed passage 12, and the discharge line 30 are exhausted by the vacuum pump 26 (step S6). Continuously, the valve V5 is opened, and, at the same time, the pressure of the nitrogen gas is adjusted by the pressure controller 36, whereby the inside of the piping is filled with the nitrogen gas at the atmospheric pressure (step S7). Then, the valve V5 is closed. After cleaning of the piping is finished as described above, the liquid source feed passage 12 is disassembled and opened to the air, and maintenance and repair operations such as equipment exchange e.g., the piping or the MFC 15, or exchange of the liquid source tank 11 are carried out.

Figure 10:
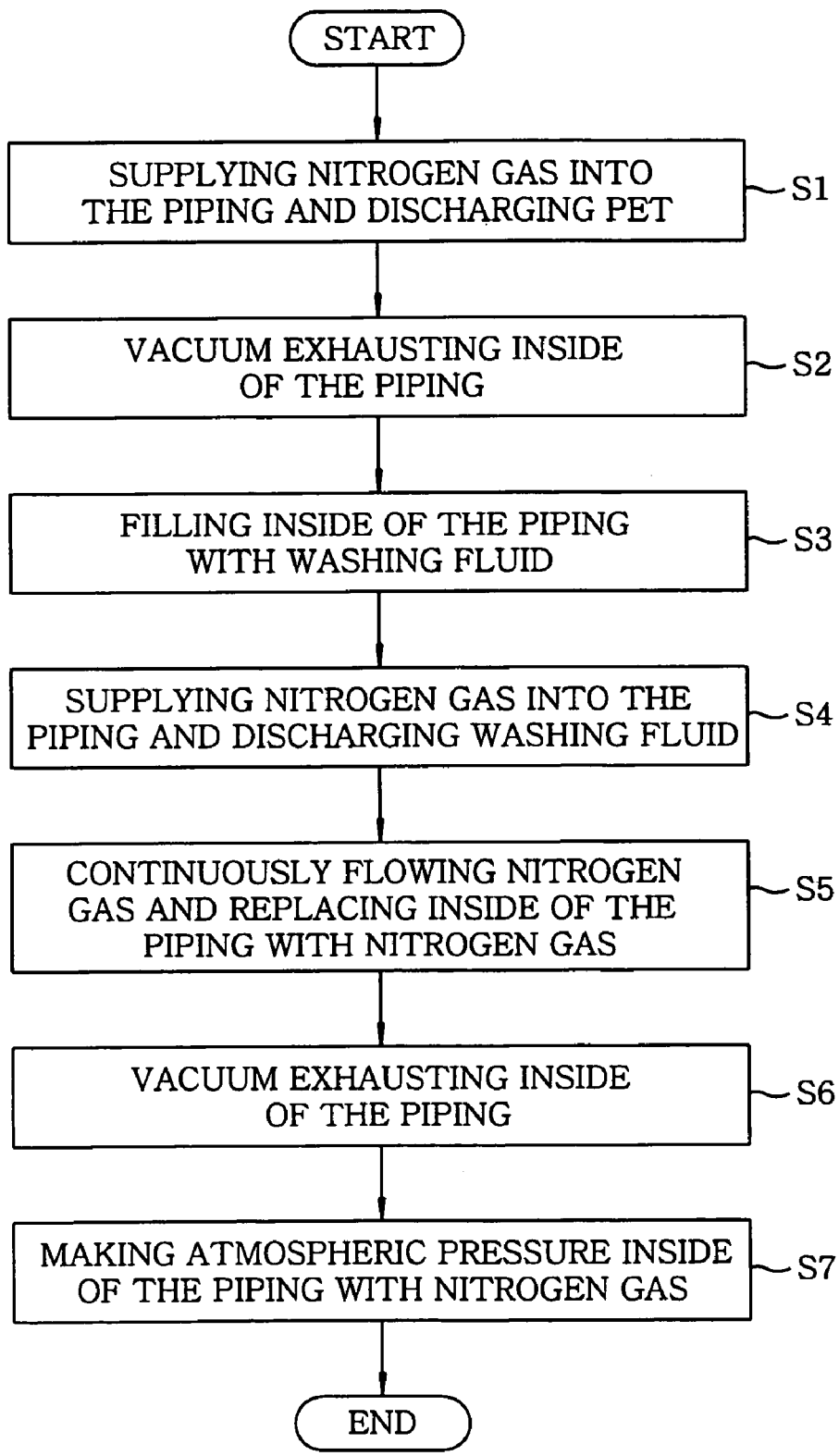
FIG. 10 shows a flowchart that illustrates the cleaning process of the feed passage of a liquid source in the processing device of FIG. 9.

Further, after completing the maintenance and repair operations and connecting the liquid source feed passage 12, steps S2 to S6 shown in FIG. 10 are performed. Namely, the inside of the piping is vacuum exhausted and filled with the washing fluid, and then, the nitrogen gas is supplied to discharge the washing fluid. After that, the inside of the piping is vacuum exhausted again. As for the washing fluid, ethanol may be used as mentioned above. Even in a case where a very small amount of moisture is present in the piping when vacuum exhausting ethanol, or present in ethanol itself, a mixture of ethanol and water evaporates first (azeotropy) since a boiling point of the mixture is lower than that of ethanol. Therefore, practically no residual moisture is present inside the piping. In addition, even if a very small amount of moisture is present in the piping, it can be efficiently removed by repeatedly performing steps S5 and S6, during a cleaning process performed before and after maintenance and repair. Thereafter, the valves V7, V11, and V4 are closed, and the valves V0 and V10 of an inlet and an outlet port side of the liquid source tank 11 are opened, so that PET inside the liquid source tank 11 is sent by helium gas pressure and would flow in the liquid source feed passage 12 of a vacuum atmosphere, thereby filling the liquid source feed passage 12. Such a cleaning process is performed, for example after constructing a piping in a new installation of a device, and then, a film forming process of tantalum oxide is performed.

The aforementioned cleaning process performed before and after maintenance and repair is performed by controlling the opening/closing of each valve, on the basis of a program stored in the memory of the system controller for controlling overall operations of the processing device.

In accordance with such a cleaning method, since PET and/or washing fluid present inside the piping is discharged by the nitrogen gas, the liquid mentioned above can be quickly removed and amount of residual liquid present can be suppressed to a very small amount. Further, even in case where a very small amount of liquid is present in the piping, it is discharged with the nitrogen gas, since the nitrogen gas substituted for the liquid described above is vacuum exhausted. As a result, PET or the washing fluid can be removed rapidly and reliably. Still further, the air present in the piping is discharged. Therefore, even in case where PET of a raw material gas, which is sensitive to moisture, is supplied after cleaning, a problem such as solidification of PET does not occur.

Still further, the present invention is not limited to a processing device having a configuration that a liquid source is vaporized in a vaporizer to supply into a processing vessel, but it may be applied to a processing device configured such that the liquid source is supplied in a liquid state and vaporized in the processing vessel.

What is claimed is:

1. A processing device, comprising:
   processing vessel in which a process is performed on an object to be processed by using a liquid source;
   a liquid source feed passage installed so as to supply the liquid source into the processing vessel from a liquid source feed source;
   a flow controller, installed at the liquid source feed passage, for controlling a flow rate of the liquid source flowing through the liquid source feed passage at a target flow rate;
   a washing fluid feed passage installed so as to supply a washing fluid from a washing fluid feed source to an upstream side of the flow controller in the liquid source common washing fluid feed source for feeding the washing fluid to the first and the second washing fluid feed passage.

2. The processing device of claim 1, further comprising a flow adjuster, which is installed at the part of the washing fluid feed passage and controls a flow rate of the washing fluid supplied into the liquid source feed passage through the part of the washing fluid feed passage.

3. The processing device of claim 1, further comprising a flow adjuster, which is installed at an upstream side of the part of the washing fluid feed passage and at least controls a flow rate of the washing fluid supplied into the liquid source feed passage through the part of the washing fluid feed passage.

4. A processing device, comprising:
   a processing vessel in which a process is performed on an object to be processed by using a liquid source;
   a liquid source feed passage installed so as to supply the liquid source into the processing vessel from a liquid source feed source;
   a flow controller, installed at the liquid source feed passage, for controlling a flow rate of the liquid source flowing through the liquid source feed passage at a target flow rate;
   a testing unit for having at least one of a function for measuring a flow rate of a washing fluid flowing through the testing unit and that for controlling the flow rate of the washing fluid flowing through the testing unit at a target flow rate;
   a first washing fluid feed passage connected to the liquid source feed passage, and installed such that the washing fluid is supplied to an upstream side of the flow controller in the liquid source feed passage without passing through the testing unit; and
   a second washing fluid feed passage connected to the liquid source feed passage and, at the same time, having a part where the testing unit is placed, the second washing fluid feed passage being installed such that the washing fluid is supplied to an upstream side of the flow controller in the liquid source feed passage through the testing unit.

5. The processing device of claim 4, wherein at least a portion of the first washing fluid feed passage is shared with at least a portion of the second washing fluid feed passage.

6. The processing device of claim 5, further comprising a flow adjuster installed at a part of the first washing fluid feed passage not shared with the second washing fluid feed passage.

7. The processing device of claim 5, further comprising a flow adjuster installed at an upstream side of the testing unit in said at least the portion of the first washing fluid feed passage shared with the second washing fluid feed passage.

8. The processing device of claim 4, further comprising a common washing fluid feed source for feeding the washing fluid to the first and the second washing fluid feed passage.

9. A method of maintaining a processing device in which a liquid source is supplied into a processing vessel through a flow controller installed at a liquid source feed passage, the method comprising:
   cleaning process for cleaning the liquid source feed passage by flowing a washing fluid to the liquid source feed passage at a first flow rate; and
   testing process for testing the flow controller by flowing the washing fluid to the flow controller at a second flow rate,
   wherein the testing process includes the steps of,
   flowing the washing fluid to the flow controller through a testing unit having at least one of a function for measuring a flow rate of the washing fluid and that for controlling a flow rate of the washing fluid at a target flow rate,
   comparing a target flow rate of the washing fluid set in the flow controller with an actual flow rate of the washing fluid measured by the testing unit in case of flowing the washing fluid to the flow controller through the testing unit, or comparing an actual flow rate of the washing fluid measured by a flow sensor prepared in the flow controller with a target flow rate of the washing fluid set in the testing unit in case of flowing the washing fluid to the flow controller through the testing unit, and
   determining whether the flow controller properly operates or not on the basis of the comparison.

10. The method of maintaining a processing device of claim 9, wherein in the cleaning process, the washing fluid is supplied into the liquid source feed passage without passing the testing unit, and wherein the first flow rate is greater than the second flow rate.

* * * * *